US012690182B2

(12) United States Patent
Nozawa

(10) Patent No.: US 12,690,182 B2
(45) Date of Patent: Jul. 21, 2026

(54) WASTE-TAPE TRANSPORT DEVICE AND MOUNTING DEVICE

(71) Applicant: FUJI CORPORATION, Chiryu (JP)

(72) Inventor: Mizuho Nozawa, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 604 days.

(21) Appl. No.: 18/249,268

(22) PCT Filed: Nov. 25, 2020

(86) PCT No.: PCT/JP2020/043775
§ 371 (c)(1),
(2) Date: Apr. 17, 2023

(87) PCT Pub. No.: WO2022/113191
PCT Pub. Date: Jun. 2, 2022

(65) Prior Publication Data
US 2023/0422458 A1      Dec. 28, 2023

(51) Int. Cl.
*H05K 13/04*        (2006.01)
*H05K 13/02*        (2006.01)

(52) U.S. Cl.
CPC ......... *H05K 13/0417* (2013.01); *H05K 13/02* (2013.01)

(58) Field of Classification Search
CPC ... H05K 13/0417; H05K 13/02; H05K 13/021
See application file for complete search history.

(56) References Cited

U.S. PATENT DOCUMENTS

| | | | | |
|---|---|---|---|---|
| 2017/0303448 A1* | 10/2017 | Iisaka | ................. | H05K 13/086 |
| 2017/0354070 A1* | 12/2017 | Kobayashi | .......... | H05K 13/086 |
| 2021/0168977 A1* | 6/2021 | Matsushita | ........ | H05K 13/0452 |

FOREIGN PATENT DOCUMENTS

| | | |
|---|---|---|
| CN | 203975866 U | 12/2014 |
| CN | 109516668 A | 3/2019 |
| JP | WO2015/045018 A1 | 4/2015 |

(Continued)

OTHER PUBLICATIONS

International Search Report issued Feb. 9, 2021 in PCT/JP2020/043775 filed on Nov. 25, 2020, 2 pages.

*Primary Examiner* — Thomas J Hong
*Assistant Examiner* — Jose K Abraham
(74) *Attorney, Agent, or Firm* — Oblon, McClelland, Maier & Neustadt, L.L.P.

(57) ABSTRACT

A waste-tape transport device of the present disclosure is used in a mounting device including a component supply section configured to supply a component from a tape member accommodating multiple components, and a mounting section configured to pick up the supplied component. The waste-tape transport device includes a waste-tape transport section configured to transport a waste-tape member cut after the component is picked up by placing the waste-tape member on a transport surface and deliver the waste-tape member to a waste-tape transport device adjacent in a transport direction of the waste-tape member or a waste-tape collection section, and a blowing section configured to blow gas in a direction along the transport direction onto a transport surface on a lower surface side of the waste-tape transport section.

8 Claims, 4 Drawing Sheets

(56)              References Cited

FOREIGN PATENT DOCUMENTS

| | | | | |
|---|---|---|---|---|
| JP | 2018018874 A | * | 2/2018 | ......... H05K 13/0417 |
| JP | 2018018875 A | * | 2/2018 | ............. H05K 13/02 |
| WO | WO-2015045018 A1 | * | 4/2015 | ......... H05K 13/0417 |
| WO | WO-2017026030 A1 | * | 2/2017 | ............. H05K 13/02 |

* cited by examiner

Fig. 1

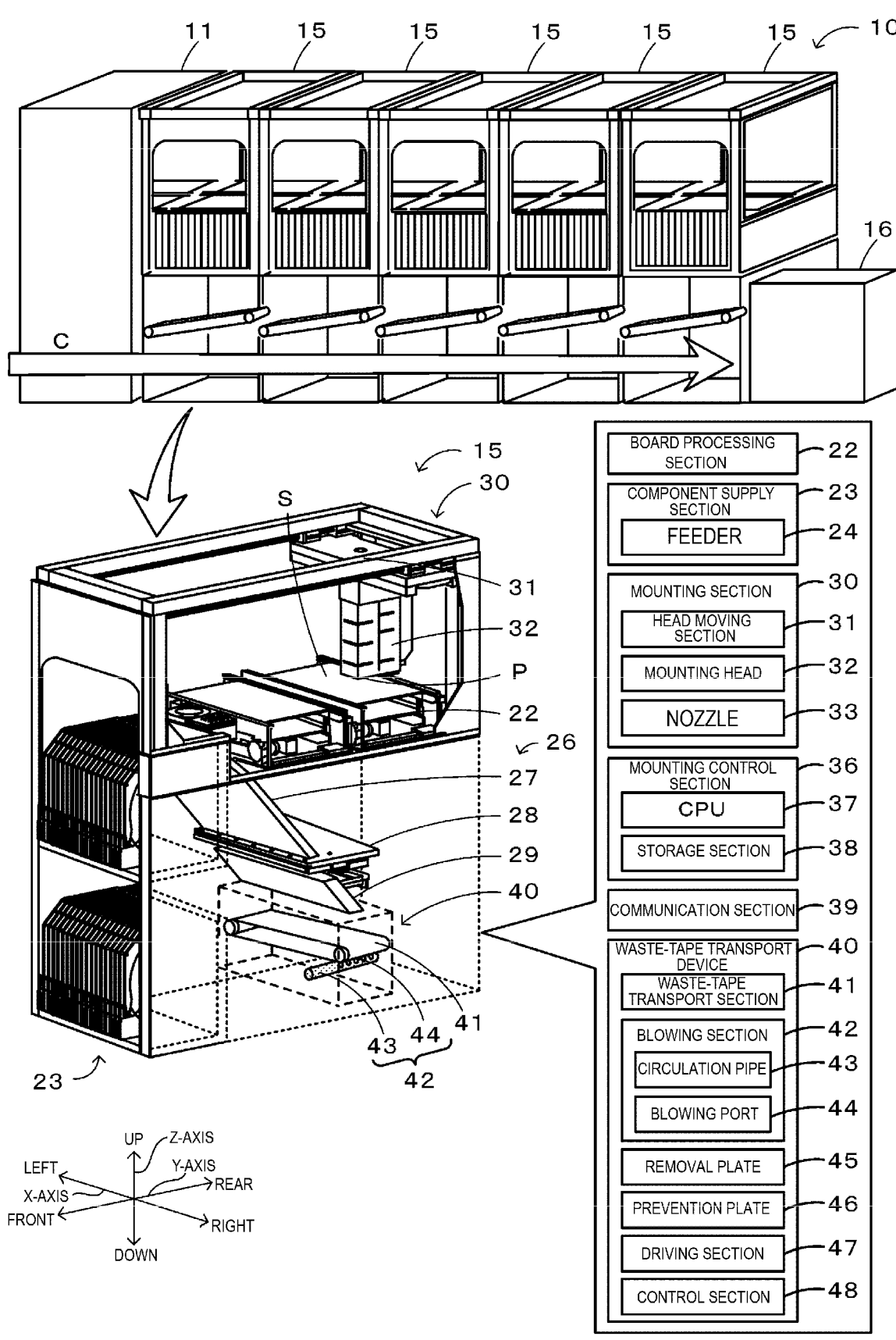

| BOARD PROCESSING SECTION | 22 |
| COMPONENT SUPPLY SECTION | 23 |
| FEEDER | 24 |
| MOUNTING SECTION | 30 |
| HEAD MOVING SECTION | 31 |
| MOUNTING HEAD | 32 |
| NOZZLE | 33 |
| MOUNTING CONTROL SECTION | 36 |
| CPU | 37 |
| STORAGE SECTION | 38 |
| COMMUNICATION SECTION | 39 |
| WASTE-TAPE TRANSPORT DEVICE | 40 |
| WASTE-TAPE TRANSPORT SECTION | 41 |
| BLOWING SECTION | 42 |
| CIRCULATION PIPE | 43 |
| BLOWING PORT | 44 |
| REMOVAL PLATE | 45 |
| PREVENTION PLATE | 46 |
| DRIVING SECTION | 47 |
| CONTROL SECTION | 48 |

UP / Z-AXIS
LEFT / Y-AXIS
X-AXIS / REAR
FRONT / RIGHT
DOWN

WASTE-TAPE TRANSPORT DEVICE AND MOUNTING DEVICE

TECHNICAL FIELD

The present description discloses a waste-tape transport device and a mounting device.

BACKGROUND ART

The conventional art proposes a mounting device including a waste-tape transport device that transports a waste-tape generated by component supply by a component supply device (tape feeder) in a direction parallel to a board transport direction, in which, in a case where multiple component mounting devices are installed to configure a component mounting line, the waste-tape is delivered between the waste-tape transport devices of the component mounting devices adjacent to each other (for example, see Patent Literature 1). In the device, since the waste-tape generated in each device can be gathered and collected at one location, the collection work of the waste-tape can be performed with higher efficiency.

PATENT LITERATURE

Patent Literature 1: International Publication WO2015/45018

BRIEF SUMMARY

Technical Problem

However, in Patent Literature 1, in a case where a waste-tape member or the like on which static electricity is easily charged, the waste-tape member is stuck on a transport surface of the waste-tape transport device, so that it is difficult to stably deliver the waste-tape member to the next waste-tape transport device.

The present disclosure has been made in view of such problems, and an object of the present disclosure is to provide a waste-tape transport device and a mounting device capable of stably transporting a waste-tape member.

Solution to Problem

The present disclosure employs the following means in order to achieve the above-described object.

A waste-tape transport device of the present disclosure is used in a mounting device including a component supply section configured to supply a component from a tape member accommodating multiple components, and a mounting section configured to pick up the supplied component, the waste-tape transport device including a waste-tape transport section configured to transport a waste-tape member cut after the component is picked up by placing the waste-tape member on a transport surface and deliver the waste-tape member to a waste-tape transport device adjacent in a transport direction of the waste-tape member or a waste-tape collection section, and a blowing section configured to blow gas in a direction along the transport direction onto a transport surface on a lower surface side of the waste-tape transport section.

In the waste-tape transport device, the waste-tape member is transported by the waste-tape transport section configured to deliver the waste-tape member to the adjacent waste-tape transport device or the waste-tape collection section. In the waste-tape transport device, gas is blown in the direction along the transport direction onto the transport surface on the lower surface side of the waste-tape transport section, so that the waste-tape member is prevented from remaining stuck on the transport surface. Therefore, in the waste-tape transport device, the waste-tape member can be stably transported.

BRIEF DESCRIPTION OF DRAWINGS

FIG. 1 is a schematic explanatory diagram showing an example of mounting system 10 and mounting device 15.

DESCRIPTION OF EMBODIMENTS

Figure 2:
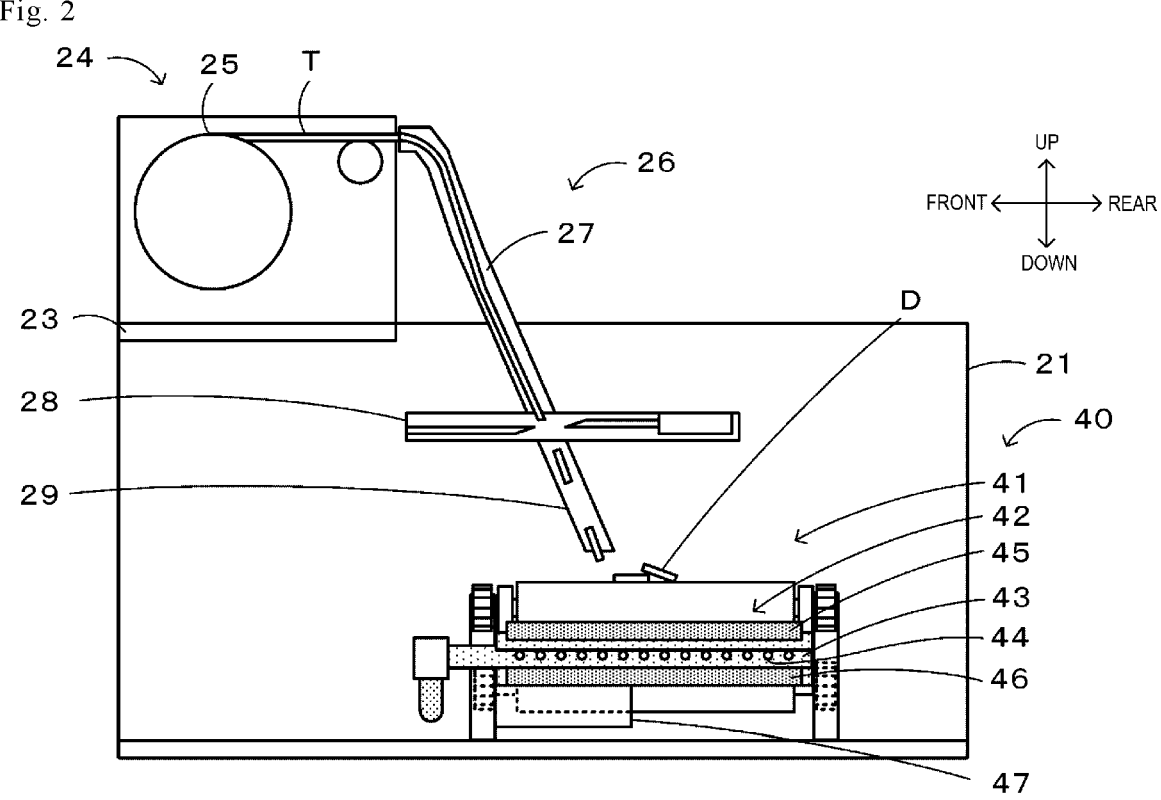
FIG. 2 is a configuration diagram schematically showing configurations of waste-tape discharge section 26 and waste-tape transport device 40.
Figure 3:
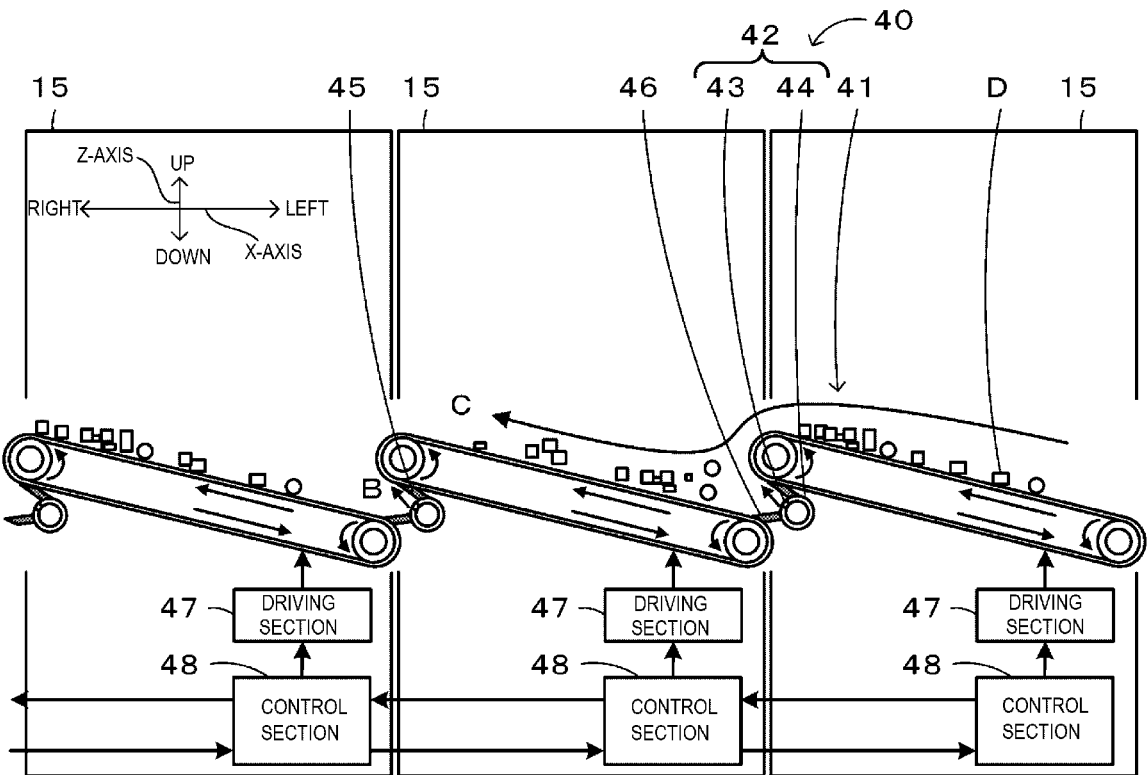
FIG. 3 is an explanatory diagram showing an example of the configuration of waste-tape transport device 40.
Figure 4:
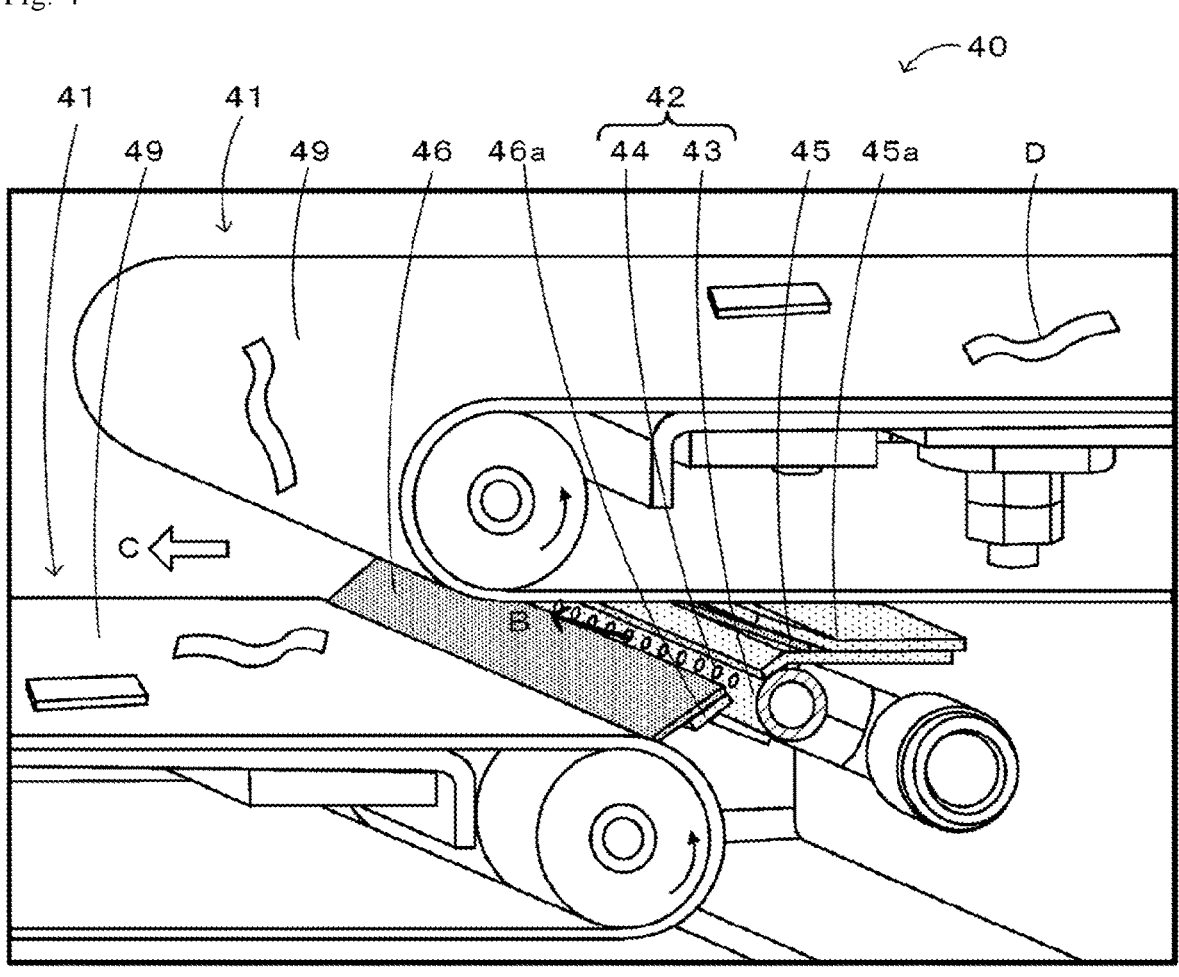
FIG. 4 is a perspective view of a connecting part of waste-tape transport sections 41 as viewed from above.
Figure 5:
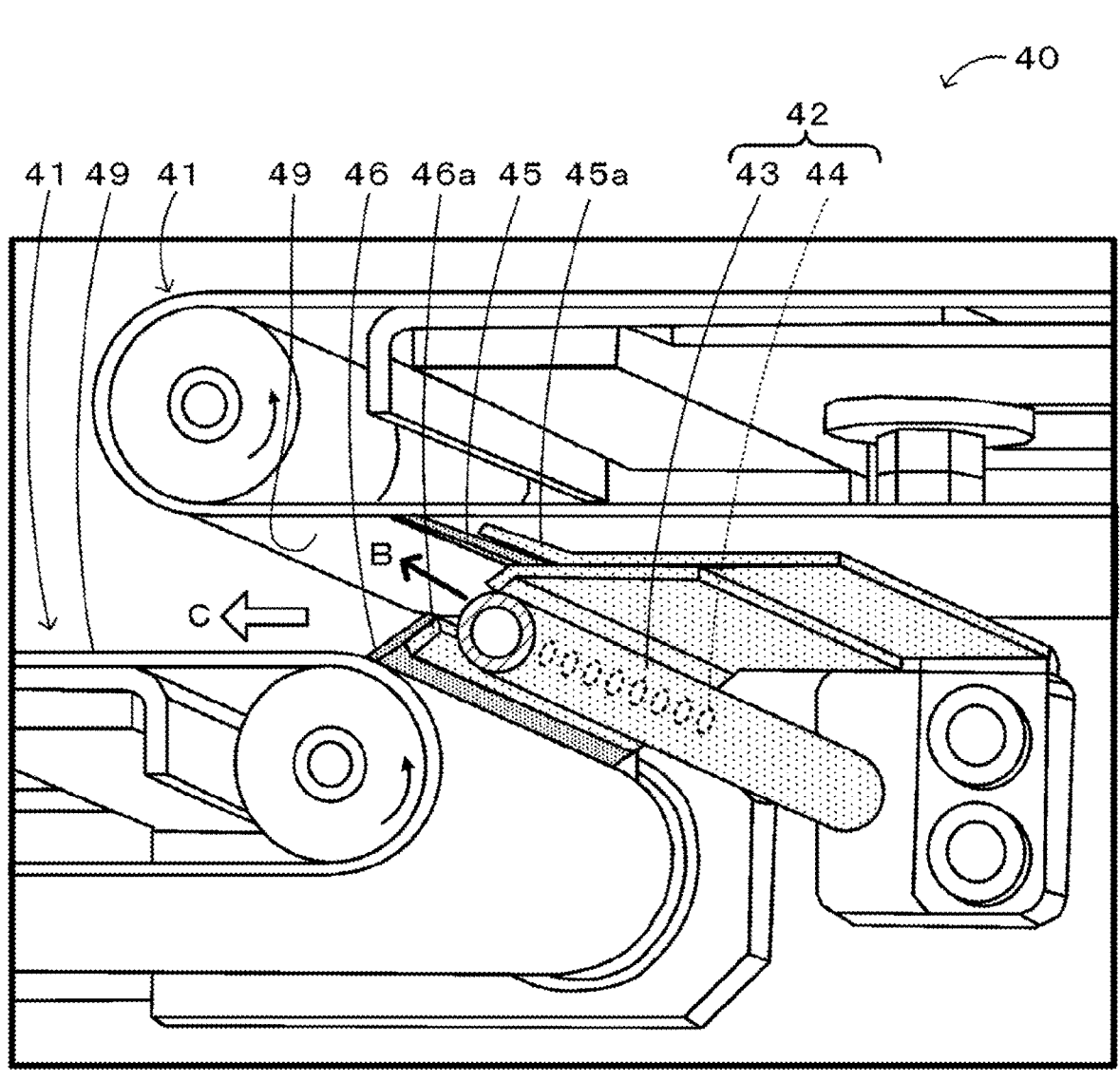
FIG. 5 is a perspective view of a connecting part of waste-tape transport sections 41 as viewed from below.

The present embodiment will be described below with reference to the drawings. FIG. 1 is a schematic explanatory diagram showing an example of mounting system 10 and mounting device 15 of the present disclosure. FIG. 2 is a configuration diagram schematically showing configurations of waste-tape discharge section 26 and waste-tape transport device 40. FIG. 3 is an explanatory diagram showing an example of the configuration of waste-tape transport device 40. FIG. 4 is a perspective view of a connecting part of waste-tape transport sections 41 as viewed from above. FIG. 5 is a perspective view of a connecting part of waste-tape transport sections 41 as viewed from below. In the present embodiment, a left-right direction (X-axis), a front-rear direction (Y-axis), and an up-down direction (Z-axis) are as shown in FIGS. 1 to 3.

In mounting system 10, for example, multiple mounting devices 15 that perform a mounting process of component P on board S as a process target object are arranged in transport direction C of board S to configure a mounting line. Here, the process target object will be described as board S, but the process target object is not particularly limited as long as the process target object is an object on which component P is mounted, and may be a substrate having a three-dimensional shape. As shown in FIG. 1, mounting system 10 includes printing device 11, mounting device 15, and waste-tape collection section 16. For example, mounting system 10 may include, as a mounting-related device, one or more of a print inspection device that performs inspection of a print state of board S, a transport device that transports board S, a print inspection device that performs inspection of a print state of board S, a mounting inspection device that inspects an arrangement state of component P on board S, a storage device that stores spare feeder 24, and a reflow device that reflows solder paste. Printing device 11 is a device that prints the solder paste or the like on board S.

Mounting device 15 is a device that picks up component P and mounts component P on board S. As shown in FIGS. 1 and 2, mounting device 15 includes board processing section 22, component supply section 23, waste-tape discharge section 26, mounting section 30, mounting control section 36, communication section 39, and waste-tape transport device 40.

Board processing section 22 is a unit that conveys in board S, transports board S, fixes board S at a mounting position, and conveys out board S. Component supply section 23 is a unit that supplies component P to mounting section 30. Component supply section 23 mounts feeder 24 including reel 25 around which tape member T (see FIG. 2) serving as a holding member that holds component P is wound, on one or more mounting portions. Component P is protected by a film covering a surface of tape member T, tape member T is pulled out from reel 25, and the film is peeled off before component P moves to a pickup position of component P, so that component P is exposed. After component P is picked up, tape member T and the film are sent to waste-tape discharge section 26.

Mounting section 30 is a unit that picks up component P from component supply section 23 and disposes component P on board S fixed to board processing section 22. Mounting section 30 includes head moving section 31, mounting head 32, and nozzle 33. Head moving section 31 includes a slider that moves in XY directions while being guided by a guide rail, and a motor that drives the slider. Mounting head 32 picks up one or more components P and is moved in the XY directions by head moving section 31. Mounting head 32 is detachably mounted on the slider. One or more nozzles 33 are detachably mounted on a lower surface of mounting head 32. Nozzle 33 picks up component P by using a negative pressure. A pickup member that picks up component P may be a mechanical chuck or the like that mechanically holds component P, in addition to nozzle 33.

As shown in FIG. 2, waste-tape discharge section 26 includes introduction duct 27, tape cutter 28, and discharge duct 29. Introduction duct 27 is provided behind feeder 24 mounted on the mounting portion of component supply section 23, and is a passage for introducing tape member T after component P is picked up. Tape cutter 28 is a device that finely cuts tape member T introduced into introduction duct 27 by a cutter. Discharge duct 29 is a passage for discharging cut waste-tape member D. Each time feeder 24 feeds tape member T for supplying component P, tape cutter 28 drives the cutter to cut tape member T into waste-tape member D. Waste-tape member D cut by tape cutter 28 is supplied to waste-tape transport device 40 through discharge duct 29, and is transported to waste-tape collection section 16 by waste-tape transport device 40. Waste-tape collection section 16 is a device that collects waste-tape member D conveyed out by waste-tape transport device 40. Waste-tape member D collected by waste-tape collection section 16 may be transported to a discard accommodation section outside the device by, for example, a negative pressure. In addition, an operator may periodically discard waste-tape member D collected by waste-tape collection section 16 or waste-tape member D accommodated in the discard accommodation section.

Mounting control section 36 is configured as a microprocessor centered on CPU 37, and controls the entire device. Mounting control section 36 has storage section 38. Storage section 38 stores mounting condition information (production job) including information of component P or information on an arrangement order in which components P are mounted on board S, an arrangement position, or a mounting position of feeder 24 that picks up component P. Mounting control section 36 outputs control signals to board processing section 22, component supply section 23, or mounting section 30, while inputting signals from board processing section 22, component supply section 23, or mounting section 30. Communication section 39 is an interface for exchanging information with an external device.

Waste-tape transport device 40 is a device that transports waste-tape member D discharged by waste-tape discharge section 26 to an outside of the device. As shown in FIGS. 1 to 5, waste-tape transport device 40 includes waste-tape transport section 41, blowing section 42, removal plate 45, prevention plate 46, driving section 47, and control section 48. Waste-tape transport section 41 is a conveyor that is disposed in a housing of mounting device 15 along transport direction C, is disposed to be inclined upward, and transports cut waste-tape member D after component P is picked up. Waste-tape transport section 41 is configured to transport waste-tape member D by placing waste-tape member D on transport surface 49 (see FIGS. 4 and 5), and deliver waste-tape member D to waste-tape transport device 41 adjacent in transport direction C of waste-tape member D or waste-tape collection section 16. In addition, when mounting device configures the mounting line, waste-tape transport section 41 can deliver waste-tape member D to adjacent waste-tape transport device 40. As shown in FIG. 3, waste-tape transport section 41 is configured such that end portions of adjacent conveyor devices overlap each other in the up-down direction. As a result, waste-tape transport section 41 can smoothly deliver waste-tape member D to adjacent waste-tape transport section 41, and can suppress falling-off of waste-tape member D in a case of delivery.

Blowing section 42 removes waste-tape member D adhering to transport surface 49 of waste-tape transport section 41 from transport surface 49 by blowing. As shown in FIGS. 4 and 5, blowing section 42 is configured to blow gas in blowing direction B along transport direction C onto transport surface 49 on a lower surface side of a downstream side end portion of transport direction C of waste-tape transport section 41. Blowing section 42 is fixed below the vicinity of removal plate 45 contacting transport surface 49 on the lower surface side. In addition, blowing section 42 is fixed behind prevention plate 46 contacting transport surface 49 of adjacent waste-tape transport section 41. That is, blowing section 42 is provided at a position between waste-tape transport section 41 and adjacent waste-tape transport section 41 disposed below waste-tape transport section 41 or waste-tape collection section 16 when waste-tape transport device 40 configures the mounting line. Further, blowing section 42 is provided between removal plate 45 and prevention plate 46. Blowing section 42 includes circulation pipe 43, blowing port 44, and a gas supply device (not shown). Circulation pipe 43 is disposed on a lower surface side of transport surface 49 of waste-tape transport section 41, is formed in a direction orthogonal to transport direction C, and circulates gas. Examples of the gas to be circulated include air. Blowing port 44 is an opening portion formed in circulation pipe 43 toward transport surface 49 of the downstream side end portion in transport direction C of waste-tape transport section 41, and multiple blowing ports 44 are formed along circulation pipe 43 in the entire width direction of transport surface 49. The gas supply device is, for example, a device that compresses and supplies gas, such as an air compressor. The gas supply device also supplies gas to various parts (for example, an air cylinder) in the housing of mounting device 15.

Removal plate 45 is a member disposed on the lower surface side of transport surface 49 of the downstream side end portion in transport direction C of waste-tape transport section 41, and contacts transport surface 49 to remove waste-tape member D. Removal plate 45 is fixed to fixing member 45a bonded to an upper part side of circulation pipe 43 along circulation pipe 43. Removal plate 45 is formed of a flexible member, such as rubber or resin. Prevention plate 46 is a member disposed on an upper surface side of transport surface 49 of an upstream side end portion in transport direction C of adjacent waste-tape transport section 41, and contacts transport surface 49 to prevent waste-tape member D from entering. Prevention plate 46 is fixed to fixing member 46a bonded to a lower part side of circulation pipe 43 along circulation pipe 43. Prevention plate 46 is formed of a flexible member, such as rubber or resin. Blowing section 42 is bonded to removal plate 45 via fixing member 45a, and is also bonded to prevention plate 46 via fixing member 46a.

Driving section 47 is a motor connected to a driving shaft of the conveyor of waste-tape transport section 41 for rotationally driving the driving shaft. Control section 48 is a controller that controls entire waste-tape transport device 40. Control section 48 outputs a drive signal to driving section 47. In addition, control section 48 communicates with control section 48 of adjacent waste-tape transport device 40 via a communication port (not shown).

Next, an operation of mounting system 10 of the present embodiment configured as described above, first, a process in which mounting device 15 mounts component P on board S will be described. In a case where the mounting process is started, CPU 37 of mounting control section 36 reads out the mounting condition information, which is the production job, from storage section 38, and controls board processing section 22 to convey in and fix board S. Next, CPU 37 causes mounting head 32 to pick up component P from feeder 24 mounted on component supply section 23 based on the mounting condition information, and performs a process of arranging picked up component P at a predetermined position on board S. In a case where the arrangement of component P on board S is finished, CPU 37 causes board processing section 22 to discharge board S, causes board processing section 22 to convey next board S, and repeats the process of mounting component P on board S, as described above. In addition, during the mounting process, CPU 37 performs a process of causing waste-tape discharge section 26 to cut tape member T and sending generated waste-tape member D to waste-tape transport device 40.

Next, a process of conveying out waste-tape member D to waste-tape collection section 16 will be described. In a case where the mounting process is started, control section 48 drives driving section 47 to cause waste-tape transport section 41 to operate and transport waste-tape member D in transport direction C. In addition, control section 48 drives the gas supply device to supply compressed air to circulation pipe 43. The supplied compressed air is discharged from blowing port 44 and is blown onto transport surface 49 of a rear side distal end of waste-tape transport section 41. Waste-tape member D sent from waste-tape discharge section 26 is placed on transport surface 49 of waste-tape transport section 41, and is transported in transport direction C. For example, waste-tape member D includes a film that is easily charged with static electricity, in addition to a resin tape in which a cavity for accommodating component P is formed. Therefore, even in a case where waste-tape transport section 41 employs a conductive conveyor belt, a film or the like may be stuck on transport surface 49. In addition, in waste-tape transport section 41, removal plate 45 is used, so that the majority of waste-tape member D can be peeled off, but the film is thin, is interposed between removal plate 45 and the conveyor belt, and further, a film or the like may enter a gap therebetween. In waste-tape transport section 41, blowing section 42 is provided on a rear surface side of the distal end, so that waste-tape member D, such as such a film, can be sufficiently peeled off from transport surface 49 by blowing air onto transport surface 49. In waste-tape transport section 41, since there is no gap due to prevention plate 46, it is possible to prevent waste-tape member D from entering the gap between waste-tape transport sections 41.

Here, a correspondence relationship between elements of the present embodiment and elements of the present disclosure will be clarified. Waste-tape transport section 41 of the present embodiment corresponds to a waste-tape transport section of the present disclosure, and blowing section 42 corresponds to a blowing section. In addition, circulation pipe 43 corresponds to a circulation pipe, blowing port 44 corresponds to a blowing port, removal plate 45 corresponds to a removal plate, and prevention plate 46 corresponds to a prevention plate.

The waste-tape transport device 40 of the present embodiment described above transports waste-tape member D by waste-tape transport section 41 configured to deliver waste-tape member D to adjacent waste-tape transport device 40 or waste-tape collection section 16. In waste-tape transport device 40, gas, such as air, is blown in the direction along transport direction C onto transport surface 49 on the lower surface side of the downstream side end portion in transport direction C of waste-tape transport section 41, so that waste-tape member D is prevented from remaining stuck on transport surface 49. Therefore, in waste-tape transport device 40, it is possible to further suppress the movement of waste-tape member D to a place other than the transport path, such as falling-off of waste-tape member D from the gap between the waste-tape transport devices 40, so that waste-tape member D can be stably transported.

In addition, blowing section 42 is provided between waste-tape transport section 41 and adjacent waste-tape transport section 41 disposed below waste-tape transport section 41. In waste-tape transport device 40, it is possible to prevent waste-tape member D from entering between adjacent waste-tape transport sections 41 disposed one above the other. Further, blowing section 42 includes circulation pipe 43 disposed on the lower surface side of transport surface 49 of waste-tape transport section 41, formed in the direction orthogonal to transport direction C, and circulating gas, and blowing port 44 formed in circulation pipe 43. In waste-tape transport device 40, waste-tape member D can be more stably transported with a simple configuration of circulation pipe 43 and blowing port 44. Further, waste-tape transport device 40 includes removal plate 45 disposed on the lower surface side of transport surface 49 of the downstream side end portion in transport direction C of waste-tape transport section 41 and contacting transport surface 49 to remove waste-tape member D, and prevention plate 46 disposed on the upper surface side of transport surface 49 of the upstream side end portion in transport direction C of adjacent waste-tape transport section 41 and contacting transport surface 49 to prevent waste-tape member D from entering. Blowing section 42 is disposed between removal plate 45 and prevention plate 46. In waste-tape transport device 40, removal plate 45 or prevention plate 46 can be used to prevent waste-tape member D from entering a place other than the transport path. Blowing section 42 is bonded to removal plate 45 and prevention plate 46 via fixing member or fixing member 46a. Waste-tape transport device 40 has a structure in which removal plate blowing section 42, and prevention plate 46 are bonded to each other, so that it is possible to further prevent the waste-tape member from entering a place other than the transport path.

In addition, mounting device 15 includes component supply section 23 that supplies component P from tape member T accommodating multiple components P, mounting section 30 that picks up supplied component P, and waste-tape transport device 40 described above. In mounting device 15, since waste-tape transport device 40 described above is provided, waste-tape member D can be stably transported. In addition, in mounting device 15, it is possible to obtain an effect corresponding to the aspect of adopted waste-tape transport device 40. In addition, multiple mounting devices 15 are arranged and used in mounting system 10 configuring the mounting line, waste-tape transport section 41 delivers waste-tape member D to waste-tape transport device 40 adjacent in transport direction C of waste-tape member D or waste-tape collection section 16, in a case where multiple mounting devices 15 configure the mounting line. In mounting device 15, waste-tape member D can be stably transported in the mounting line.

Of course, the present disclosure is not limited to the above-described embodiment in any way, and the present disclosure can be embodied in various aspects as long as the aspects fall within the technical scope of the present disclosure.

For example, in the above-described embodiment, blowing section 42 is disposed at a position between waste-tape transport section 41 and adjacent waste-tape transport section 41 or waste-tape collection section 16, but the present disclosure may be not particularly limited to the positional relationship with the adjacent devices. For example, blowing section 42 may be disposed on the lower surface side of the downstream side end portion of transport direction C of waste-tape member D.

In the above-described embodiment, blowing section 42 includes circulation pipe 43 and blowing port 44, but the present disclosure is not particularly limited to this configuration as long as blowing section 42 can blow air onto transport surface 49 on the lower surface side. For example, blowing section 42 may include a blowing fan. Also in such waste-tape transport device 40, it is possible to further suppress the movement of waste-tape member D to a place other than the transport path, so that waste-tape member D can be stably transported.

In the above-described embodiment, the description has been made in which waste-tape transport device 40 includes removal plate 45, but the present disclosure is not particularly limited to this, and removal plate 45 need not be provided. Also in waste-tape transport device 40, waste-tape member D can be removed from transport surface 49 by blowing section 42, so that it is possible to further suppress waste-tape member D from moving to a place other than the transport path. It is preferable that waste-tape transport device 40 includes removal plate 45 in that the movement of waste-tape member D to a place other than the transport path can be further suppressed.

In the above-described embodiment, the description has been made in which waste-tape transport device 40 includes prevention plate 46, but prevention plate 46 need not be provided. Also in waste-tape transport device 40, since waste-tape member D can be moved to next waste-tape transport section 41 or waste-tape collection section 16 by blowing section 42, it is possible to further suppress the movement of waste-tape member D to a place other than the transport path. It is preferable that waste-tape transport device 40 includes prevention plate 46 in that the movement of waste-tape member D to a place other than the transport path can be further suppressed.

In the above-described embodiment, the description has been made in which blowing section 42 is bonded to removal plate 45 or prevention plate 46 via fixing members 45a and 46a, but the present disclosure is not particularly limited to this, and blowing section 42 may not be bonded to removal plate 45 or prevention plate 46. Also in waste-tape transport device 40, since waste-tape member D can be moved to next waste-tape transport section 41 or waste-tape collection section 16 by blowing section 42, it is possible to further suppress the movement of waste-tape member D to a place other than the transport path. It is preferable that waste-tape transport device 40 has a structure in which removal plate 45 or prevention plate 46 is bonded in that the movement of waste-tape member D to a place other than the transport path can be further suppressed.

Although not specifically described in the above-described embodiment, for example, waste-tape transport device 40 may include an inclination change mechanism capable of changing an inclination direction of waste-tape transport section 41, driving section 47 may be configured to rotate the conveyor shaft reversely, and blowing section 42 may be configured to be detached and attached to any of the end portions of waste-tape transport section 41. Mounting system 10 may need to change the arrangement position or transport direction C of waste-tape collection section 16 in accordance with the arrangement direction or the like. In waste-tape transport device 40, the transport direction of waste-tape member D can be easily changed.

In the above-described embodiment, mounting device 15 including waste-tape transport device 40 and mounting device 15 including waste-tape transport device 40 are described as mounting system 10, but the present disclosure is not particularly limited to this, and waste-tape transport device 40 may be adopted.

INDUSTRIAL APPLICABILITY

The waste-tape transport device and the mounting device of the present disclosure can be used, for example, in the electronic component mounting field.

REFERENCE SIGNS LIST

10: mounting system, 11: printing device, 15: mounting device, 16: waste-tape collection section, 22: board processing section, 23: component supply section, 24: feeder, 25: reel, 26: waste-tape discharge section, 27: introduction duct, 28: tape cutter, 29: discharge duct, 30: mounting section, 31: head moving section, 32: mounting head, 33: nozzle, 36: mounting control section, 37: CPU, 38: storage section, 39: communication section, 40: waste-tape transport device, 41: waste-tape transport section, 42: blowing section, 43: circulation pipe, 44: blowing port, 45: removal plate, 46: prevention plate, 45a, 46a: fixing member, 47: driving section, 48: control section, 49: transport surface, B: blowing direction, C: transport direction, D: waste-tape member, P: component, S: board, T: tape member

The invention claimed is:

1. A waste-tape transport device used in a mounting device including a component supply section configured to supply a component from a tape member accommodating multiple components, and a mounting section configured to pick up the supplied component, the waste-tape transport device comprising:

a waste-tape transport section configured to transport a waste-tape member cut after the component is picked up by placing the waste-tape member on a transport surface and deliver the waste-tape member to a waste-tape transport device adjacent in a transport direction of the waste-tape member or a waste-tape collection section, the waste-tape transport section being a conveyor with the transport surface and a lower surface below the transport surface; and a blowing section configured to blow gas onto a transport surface on the lower surface of a downstream side end of the waste-tape transport section in the transport direction of the waste-tape transport section, the blowing section being entirely disposed upstream of the downstream side end of the waste-tape transport section in the transport direction of the waste-tape transport section.

2. The waste-tape transport device according to claim 1, wherein the blowing section is provided at a position between the waste-tape transport section and an adjacent waste-tape transport section disposed below the waste-tape transport section or a waste-tape collection section.

3. The waste-tape transport device according to claim 1, wherein the blowing section includes a circulation pipe disposed on a lower surface side of the transport surface of the waste-tape transport section, formed in a direction orthogonal to the transport direction, and circulating gas, and a blowing port formed in the circulation pipe.

4. The waste-tape transport device according to claim 1, further comprising:

a removal plate disposed on a lower surface side of a transport surface of a downstream side end portion in the transport direction of the waste-tape transport section and contacting the transport surface to remove the waste-tape member; and a prevention plate disposed on an upper surface side of a transport surface of an upstream side end portion in the transport direction of an adjacent waste-tape transport section and contacting the transport surface to prevent the waste-tape member from entering, wherein the blowing section is disposed between the removal plate and the prevention plate.

5. The waste-tape transport device according to claim 4, wherein the blowing section is bonded to the removal plate and the prevention plate.

6. A mounting device comprising:

a component supply section configured to supply a component from a tape member accommodating multiple components;

a mounting section configured to pick up the supplied component; and the waste-tape transport device according to claim 1.

7. The mounting device according to claim 6, wherein multiple mounting devices are arranged and used in a mounting system configuring a mounting line, and the waste-tape transport section is configured to, in a case where the multiple mounting devices configure the mounting line, deliver the waste-tape member to a waste-tape transport device adjacent in a transport direction of the waste-tape member or a waste-tape collection section.

8. A waste-tape transport device used in a mounting device including a component supply section configured to supply a component from a tape member accommodating multiple components, and a mounting section configured to pick up the supplied component, the waste-tape transport device comprising:

a waste-tape transport section configured to transport a waste-tape member cut after the component is picked up by placing the waste-tape member on a transport surface and deliver the waste-tape member to a waste-tape transport device adjacent in a transport direction of the waste-tape member or a waste-tape collection section;

a blowing section configured to blow gas in a direction along the transport direction onto a transport surface on a lower surface side of the waste-tape transport section;

a removal plate disposed on a lower surface side of a transport surface of a downstream side end portion in the transport direction of the waste-tape transport section and contacting the transport surface to remove the waste-tape member; and a prevention plate disposed on an upper surface side of a transport surface of an upstream side end portion in the transport direction of an adjacent waste-tape transport section and contacting the transport surface to prevent the waste-tape member from entering, wherein the blowing section is disposed between the removal plate and the prevention plate, and wherein the blowing section is bonded to the removal plate and the prevention plate.

* * * * *